United States Patent [19]

Oshima et al.

[11] Patent Number: 4,868,612
[45] Date of Patent: Sep. 19, 1989

[54] SEMICONDUCTOR DEVICE UTILIZING MULTIQUANTUM WELLS

[75] Inventors: Toshio Oshima, Atsugi; Toshiro Futatsugi, Isehara, both of Japan

[73] Assignee: Fujitsu Limited, Kawasaki, Japan

[21] Appl. No.: 165,050

[22] Filed: Mar. 7, 1988

[30] Foreign Application Priority Data

Mar. 10, 1987 [JP] Japan .................... 62-53134

[51] Int. Cl.$^4$ ............................ H01L 27/12
[52] U.S. Cl. ......................... 357/4; 357/16; 357/57
[58] Field of Search .............. 357/57, 4, 4 SL, 16

[56] References Cited

U.S. PATENT DOCUMENTS 4,257,055 3/1981 Hess .
4,503,540 3/1985 Nakashima ................ 357/4
4,745,452 5/1988 Sollner ..................... 357/4 X Primary Examiner—Martin H. Edlow
Attorney, Agent, or Firm—Armstrong, Nikaido Marmelstein Kubovcik & Murray

[57] ABSTRACT

A semiconductor device comprises a first barrier layer, a quantum well layer formed on the first barrier layer and having a bottom of conduction band with an energy which varies with a curve of second order, a second barrier layer formed on said quantum well layer, and first and second contact layers. The first barrier layer, the quantum well layer and the second barrier layer make up a layer sequence which is repeated a predetermined number of times, and the first contact layer connects to the first barrier layer in a first of the predetermined number of layer sequences, while the second contact layer connects to the second barrier layer in a last of the predetermined number of layer sequences.

7 Claims, 5 Drawing Sheets

SEMICONDUCTOR DEVICE UTILIZING MULTIQUANTUM WELLS

BACKGROUND OF THE INVENTION

The present invention generally relates to semiconductor devices, and more particularly to a semiconductor device utilizing multiquantum wells.

Generally, a quantum well refers to a square potential well having a potential of such a size that electrons or holes confined therein show a quantum effect, and quantum states of different energies (levels) are generated within the quantum well. For example, when two quantum wells are formed adjacent to each other, carriers may with a certain rate (probability) move by tunneling between the quantum wells. In this case, the tunneling rate of the carriers at a certain quantum level in a first quantum well becomes large when a second quantum well has a quantum level identical to or close to that of the first quantum well, and becomes small when the second quantum well does not have a quantum level close to that of the first quantum well. Theoretically, when a plurality of such quantum wells are arranged and a bias voltage is applied across two ends of the quantum well arrangement, it is possible to generate a tunnelling simultaneously in all of the quantum wells at a certain bias voltage. By using this phenomenon, it is possible to obtain elements such as a negative resistance element, a semiconductor laser having a high quantum efficiency and capable of operating at a high speed, and a photodiode having a high sensitivity and capable of operating at a high speed.

The conventional semiconductor element such as the negative resistance element either uses no quantum well or simply uses a single quantum well. For this reason, the negative resistance element suffers the following deficiencies.

For example, in the case of an Esaki diode having a $p^+$-$n^+$ junction, which is a kind of negative resistance element, it is necessary to heavily dope the $p^+$-type and $n^+$-type regions of the Esaki diode. However, it is difficult to control such a heavy doping, and the depth of the $p^+$-$n^+$ junction cannot be accurately controlled. In addition, to avoid a change in the current versus voltage characteristic, the Esaki diode should be operated below a certain temperature such that the effects of impurity diffusion and drift can be neglected.

Similarly, as another kind of negative resistance element, there is a resonant tunnel diode which uses a single quantum well, that is, double potential barriers, but a ratio between a peak current at a resonant point and a valley current at a non-resonant point is small, because the valley current is added with a current component of inelastic tunnel. The inelastic tunnel refers to the tunnel caused by the inelastic scattering of the carriers.

In addition, in the normal semiconductor laser, there are problems in that the wavelength of the emitted light is limited by the energy band gap, the light emitting operation is slow because it is dependent on the p-n recombination rate, the half-width and monochromaticity are poor because a transition takes place among a plurality of different quantum states, and the frequency of the light modulation is governed by the carrier storage time and cannot be increased.

Furthermore, the photodiode does not operate unless the bias voltage is set to a sufficiently large voltage, and it is difficult to operate the photodiode at a high speed since the operation speed is determined by the transit time of the carriers in a depletion region.

Many of the problems described heretofore can be eliminated theoretically by providing multiquantum wells. But in actual practice, it is difficult to make the carriers tunnel through the multiquantum wells with a high rate, because it becomes difficult to match the quantum levels in the multiquantum wells as the number of quantum wells becomes large due to the fact that the multiquantum wells are square wells.

SUMMARY OF THE INVENTION

Accordingly, it is a general object of the present invention to provide a novel and useful semiconductor device in which the problems described heretofore are eliminated.

Another and more specific object of the present invention is to provide a semiconductor device provided with multiquantum wells having a bottom of conduction band with an energy described by a curve of second order. Such wells are the so-called "parabolic wells". According to the semiconductor device of the present invention, it is possible to set a logic amplitude to a large value because it is possible to obtain a large ratio between a peak current and a valley current in a negative resistance characteristic of a transistor or tunnel diode. In the case of a light emitting device such as an active device and a semiconductor laser, it is possible to realize a high speed operation of the device and obtain a large light emission with ease because the quantum efficiency of the light emitting device is large. In the case of a light receiving device, it is possible to obtain a high sensitivity with ease.

Still another object of the present invention is to provide a semiconductor device comprising a first barrier layer, a quantum well layer formed on the first barrier layer and having a bottom of conduction band with an energy which varies with a curve of second order, a second barrier layer formed on said quantum well layer, and first and second contact layers. The first barrier layer, the quantum well layer and the second barrier layer make up a layer sequence which is repeated a predetermined number of times, and the first contact layer connects to the first barrier layer in a first of the predetermined number of layer sequences, while the second contact layer connects to the second barrier layer in a last of the predetermined number of layer sequences. The semiconductor device may be a negative resistance diode, a hot electron transistor, a laser diode, a photodetector and the like.

Other objects and further features of the present invention will be apparent from the following detailed description when read in conjunction with the accompanying drawings.

DETAILED DESCRIPTION

Figure 1:
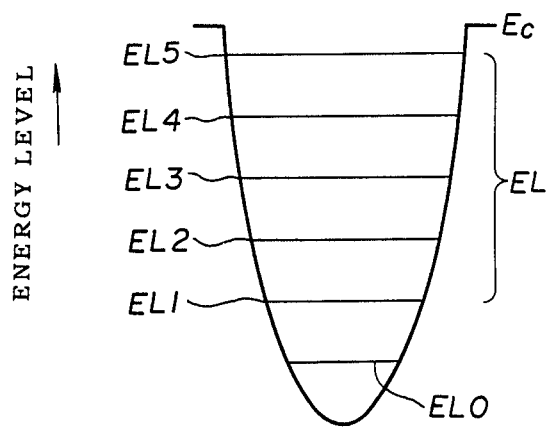
FIG. 1 shows an energy band diagram of a quantum well having a bottom of conduction band with an energy described by a curve of second order.

Recently, there is study on a quantum well having a bottom of conduction band with an energy (potential) described by a curve of second order, and FIG. 1 shows an energy band diagram of this quantum well. Unless specifically stated, the electrons will be assumed to be the carriers in the description given hereunder. Furthermore, the quantum well having the bottom of conduction band with the energy described by the curve of second order will simply be referred as a quantum well having a potential described by a curve of second order. This kind of quantum well is sometimes called "parabolic well".

In FIG. 1, $E_C$ denotes the energy level at the bottom of the conduction band, EL0 denotes a ground state within the quantum well, EL1, EL2, ... denote excited states within the quantum well, and EL denotes the excited states within the quantum well as a whole. As may be seen from FIG. 1, the energy $E_C$, that is, the potential of the quantum well, is described a curve of second order which is concave upward. The electrons confined in the quantum well has a fixed energy value described by $E_n = (n + \frac{1}{2})\omega$, where n is a positive integer including zero, is equal to $h/2\pi$ where h denotes Planck's constant, and $\omega$ is equal to $(K/m^*)^{\frac{1}{2}}$ where K denotes a second derivative of the potential and $m^*$ denotes the effective mass. In this quantum well, the quantum levels exist at equal energy intervals.

When two or more of such quantum wells having the potential described by the curve of second order are arranged adjacently and a bias voltage is applied across two ends of the quantum well arrangement, a tunneling occurs simultaneously in the ground state EL0 and the excited states EL at a certain bias voltage, and the carriers tunnel through a plurality of potential barriers with a high rate. This tunneling occurs at a high speed, and a current generated thereby is large. In other words, a peak current at a resonant point is large.

On the other hand, when the bias voltage deviates from the certain bias voltage and the resonant condition is no longer met, the tunneling rate decreases sharply. The reason for this sharp decrease in the tunneling rate is not only due to the fact that the tunneling rate at one potential barrier decreases, but also because a plurality of such potential barriers must be penetrated. Hence, a valley current at a non-resonant point is small.

Therefore, in the semiconductor device provided with the multiquantum wells having the potential described by the curve of second order, it is possible to set a ratio between the peak current and the valley current to a large value.

As the light emission, all of the excited electrons are subject to induced emission because the energy intervals of the quantum levels are all the same. Accordingly, the quantum efficiency becomes extremely high, and the electrons move ballistically at a high speed making it possible to modulate the light at a high frequency.

Figure 2:
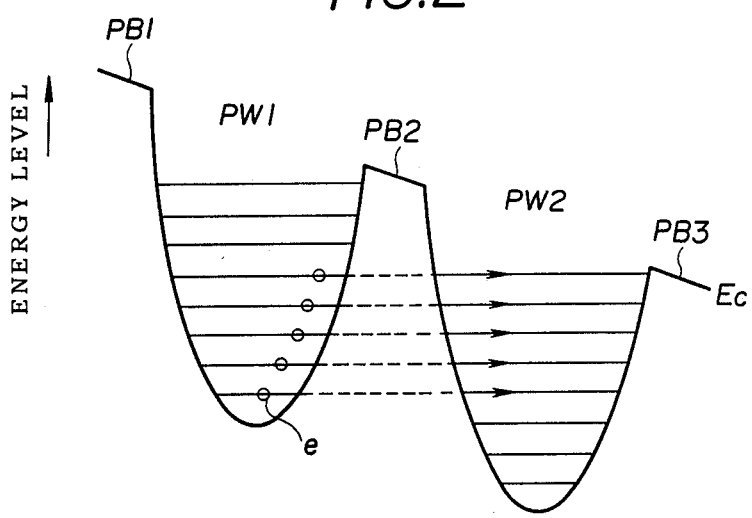
FIGS. 2 and 3 show energy band diagrams for a case where two quantum wells having the bottom of conduction band with an energy described by the curve of second order are arranged adjacently and a case where three quantum wells having the bottom of conduction band with an energy described by the curve of second order are arranged adjacently, respectively.
Figure 3:
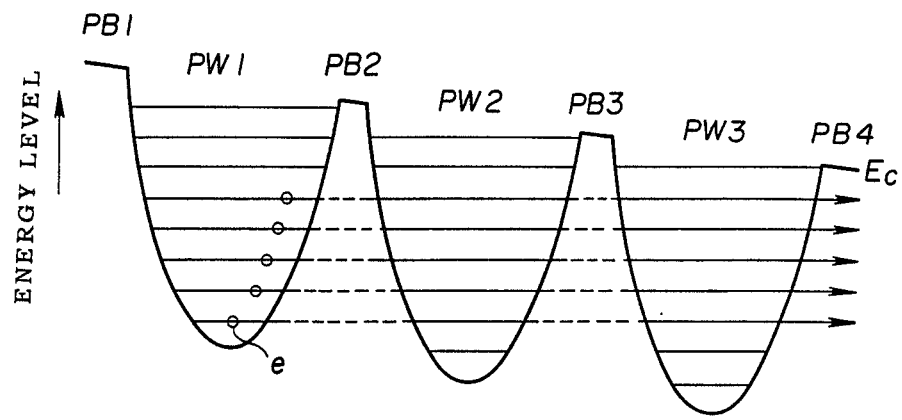

FIGS.2 and 3 show energy band diagrams for a case where two quantum wells having the potential described by the curve of second order are arranged adjacently and a case where three quantum wells having the potential described by the curve of second order are arranged adjacently, respectively. In FIGS. 2 and 3, the same designations are used as in FIG. 1.

In FIGS. 2 and 3, e denotes the electrons, PB1 through PB4 denote barrier layers, and PW1 through PW3 denote well layers. As may be seen from these figures, the quantum levels in the well layers PW1 through PW3 all exist at equal energy intervals, and these quantum levels will always coincide when an appropriate bias voltage is applied across two ends of the quantum well arrangement. When the quantum levels coincide, the electrons e can tunnel through potential barriers of the barrier layers PB1 through PB4.

Figure 4:
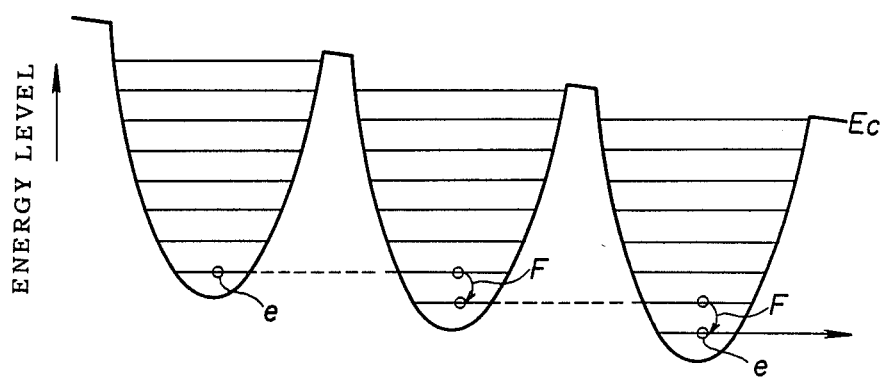
FIG. 4 shows an energy band diagram for explaining a case where a transition from the first excited state to the ground state occurs successively in the three quantum wells shown in FIG.3.

FIG. 4 shows an energy band diagram for explaining a case where a transition from the first excited state to the ground state occurs successively in the three quantum wells PW1 through PW3 shown in FIG. 3. In FIG. 4, arrows F indicate that the electrons e undergo transition between the excited state and the ground state after the tunneling.

Therefore, the semiconductor device according to the present invention uses multiquantum wells having the potential described by the curve of second order.

Figure 5:
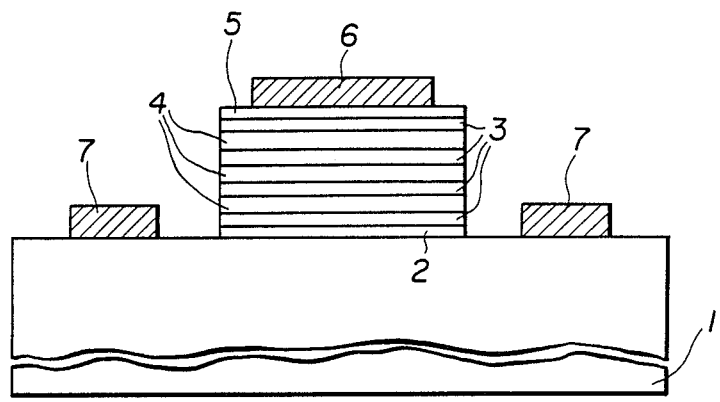
FIG. 5 is a cross sectional view from the side showing an essential part of an embodiment of the semiconductor device according to the present invention.

FIG. 5 shows an embodiment of the semiconductor device according to the present invention. FIG. 5 shows an essential part of a negative resistance diode, but the construction will be similar for a photodiode. The negative resistance diode comprises an n+-type gallium arsenide (GaAs) substrate 1, an aluminum gallium arsenide ($Al_xGa_{1-x}As$) buffer layer 2, $Al_xGa_{1-x}As$ barrier layers 3, well layers 4 each made up of a first layer made of $Al_xGa_{1-x}As$, a second layer made of GaAs and a third layer made of $Al_xGa_{1-x}As$, an n+-type GaAs electrode contact layer 5, and electrodes 6 and 7. The barrier layers 3 and the well layers 4 constitute the quantum well having the potential described by the curve of second order.

In the present embodiment, there are six barrier layer 3 and five well layers 4. The substrate 1 has an impurity concentration of $1 \times 10^{18} cm^{-3}$, the buffer layers 2 has an Al content x of 0.3 and a film thickness of 2000 Å, the barrier layers 3 have an Al content x of 0.3 and a film thickness of 100 Å, the well layers 4 have a film thickness of 200 Å, the electrode contact layer 5 has an impurity concentration of $2 \times 10^{18}$ cm$^{-3}$ and a film thickness of 4000 Å, and the electrodes 6 and 7 are made of gold germanium (AuGe) (or gold (Au)) and have a film thickness of 200 Å (or 3000 Å). The first AlGaAs layer of the well layer 4 has an Al content x of 0.3, the second GaAs layer of the well layer 4 has an Al content x of 0.00, and the third AlGaAs layer of the well layer 4 has an Al content x of 0.3.

Figure 6:
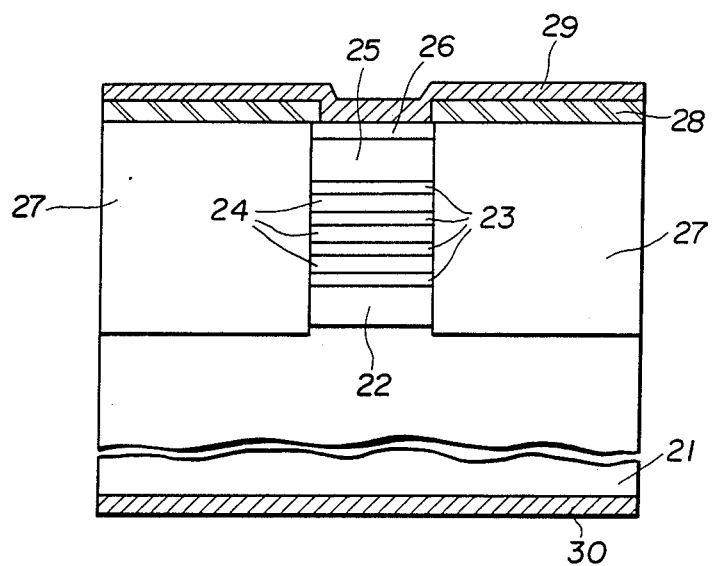
FIG. 6 is a cross sectional view from the front showing an essential part of another embodiment of the semiconductor device according to the present invention.

FIG. 6 shows another embodiment of the semiconductor device according to the present invention. FIG. 6 shows an essential part of a semiconductor laser (or laser diode). The semiconductor laser comprises an n+-type GaAs substrate 21, an n-type $Al_xGa_{1-x}As$ cladding layer 22, $Al_xGa_{1-x}As$ barrier layers 23, well layers 24 each made up of a first layer made of $Al_xGa_{1-x}As$, a second layer made of GaAs and a third layer made of $Al_xGa_{1-x}As$, an n-type $Al_xGa_{1-x}As$ cladding layer 25, an n+-type GaAs electrode contact layer 26, an intrinsic $Al_xGa_{1-x}As$ buried layer 27, a silicon dioxide ($SiO_2$) insulator layer 28, and electrodes 29 and 30. The barrier layers 23 and the well layers 24 constitute the quantum well having the potential described by the curve of second order and act as an activation layer.

In the present embodiment, there are ten barrier layers 23 and none well layers 24. The substrate 21 has an impurity concentration of $1 \times 10^{18}$ cm$^{-3}$, the cladding layer 22 has a film thickness of 2000 Å, an Al content x of 0.3 and an impurity concentration of $1 \times 10^{17}$ cm$^{-3}$, the barrier layer 23 have a film thickness of 100 Å and an Al content x of 0.3, the well layers 24 have a film thickness of 200 Å, the cladding layer 25 has a film thickness of 2000 Å, an Al content x of 0.3 and an impurity concentration of $1 \times 10^{17}$ cm$^{-3}$, the electrode contact layer 26 has a film thickness of 4000 Å and an impurity concentration of $2 \times 10^{18}$ cm$^{-3}$, the buried layer 27 has a film thickness of 11000 Å, an Al content x of 0.3 and an impurity concentration of $1 \times 10^{16}$ cm$^{-3}$, the insulator layer 28 has a film thickness of 4000 Å, and the electrodes 29 and 30 are made of AuGe (Au) and have a film thickness of 200 Å (or 3000 Å). The first AlGaAs layer of the well layer 24 has an Al content x of 0.3, the second GaAs layer of the well layer 24 has an Al content x of 0.00, and the third AlGaAs layer of the well layer 24 has an Al content x of 0.3.

Figure 7A:
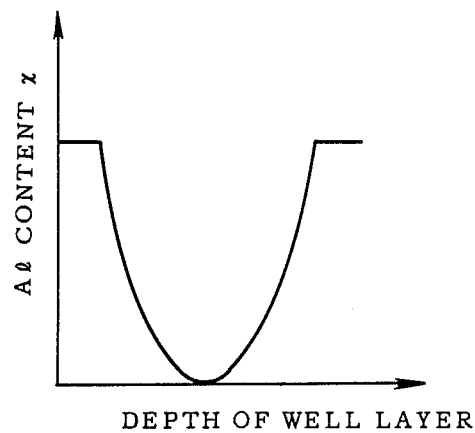
FIGS.7A and 7B are diagrams for explaining a method of obtaining the quantum well having the bottom of conduction band with an energy described by the curve of second order by varying an Al content x in a well layer.
Figure 7B:
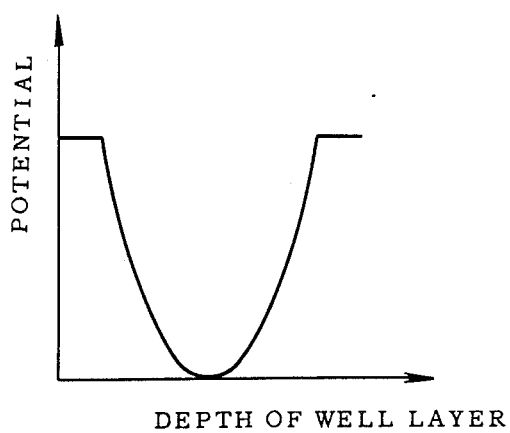

FIGS. 7A and 7B show diagrams for explaining a method of forming the quantum well having the potential described by the curve of second order. FIG. 7A shows the relationship between the depth of the well layer and the Al content x thereof, while FIG. 7B shows the relationship between the depth of the well layer and the potential thereof.

As may be seen from FIGS. 7A and 7B, when the Al content x is varied with a curve of second order, the potential also varies with a curve of second order thereby forming a quantum well having the potential described by the curve of second order.

Figure 8A:
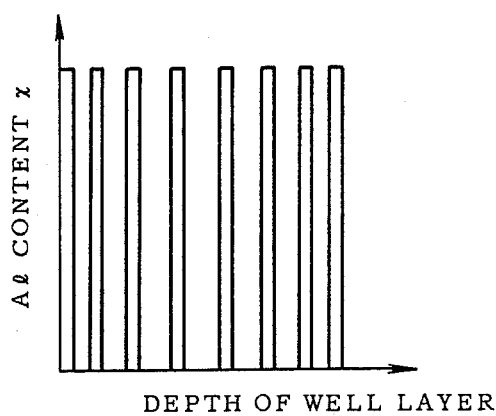
FIGS.8A and 8B are diagrams for explaining a method of obtaining the quantum well having the bottom of conduction band with an energy described by the curve of second order by varying the film thickness of a well layer.
Figure 8B:
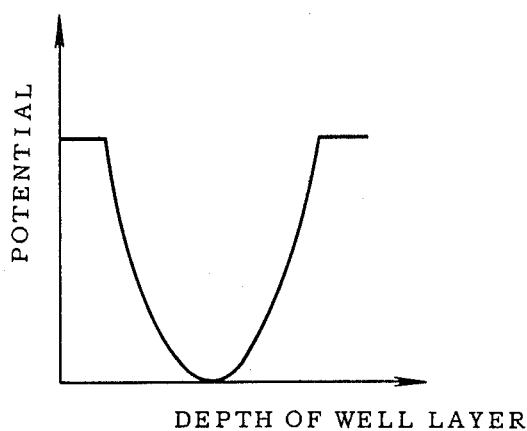

FIGS. 8A and 8B show diagrams for explaining another method of forming the quantum well having the potential described by the curve of second order. FIG. 8A shows the relationship between the depth of the well layer and the Al content x thereof, while FIG. 8B shows the relationship between the depth of the well layer and the potential thereof.

As may be seen from FIGS. 8A and 8B, the quantum well having the potential described by the curve of second order is formed by varying the film thickness of the well layer while maintaining the Al content x and the film thickness of the barrier layer constant.

The present invention may be applied to semiconductor devices other than those of the embodiments described before. For example, it is possible to improve various characteristics of a hot electron transistor (or resonant hot electron transistor) by inserting the quantum well having the potential described by the curve of second order as a potential barrier between emitter and base of the hot electron transistor. In addition, it is possible to use indium phosphor (InP) or indium aluminum arsenide (InAlAs) in place of AlGaAs, and use indium gallium arsenide (InGaAs) in place of GaAs.

Further, the present invention is not limited to these embodiments, but various variations and modifications may be made without departing from the scope of the present invention.

What is claimed is

1. A semiconductor device comprising:
   a first barrier layer;
   a second barrier layer;
   a parabolic quantum well layer formed between said first and second barrier layers and having a bottom of a conduction band with an energy which varies from a junction between the first barrier and the parabolic quantum well layer to a function between the second barrier layer and the parabolic quantum well layer with a parabolic curve so that bottoms of conduction bands at the junctions between the first and second barrier layers and the parabolic quantum well layer are higher than at a central portion of the parabolic quantum well layer, said first barrier layer, said parabolic quantum well layer and said second barrier layer making up a layer sequence which is repeated a predetermined number of times;
   a first contact layer connected to the first barrier layer in a first of the predetermined number of layer sequences; and
   a second contact layer connected to the second barrier layer in a last of the predetermined number of layer sequences.

2. A semiconductor device as claimed in claim 1 in which each of said layer sequences forms a parabolic quantum well having a bottom of conduction band with an energy level described by a parabolic curve.

3. A semiconductor device as claimed in claim 1 which further comprises a first cladding layer formed between said predetermined number of layer sequences and said first contact layer, and a second cladding layer formed between said predetermined number of layer sequences and said second contact layer, said predetermined number of layer sequences functioning as an activation layer.

4. A semiconductor device comprising:
   a first barrier layer;
   a second barrier layer, said first and second barrier layers being made of aluminum gallium arsenide ($Al_xGa_{1-x}As$);
   a parabolic quantum well layer formed between said first and second barrier layers and having a bottom of a conduction band with an energy which varies from a junction between the first barrier layer and the parabolic quantum well layer to a junction between the second barrier layer and the parabolic quantum well layer with a parabolic curve so that bottoms of conduction bands at the junctions between the first and second barrier layers and the parabolic quantum well layer are higher than at a central portion of the parabolic quantum well layer, said first barrier layer, said parabolic quantum well layer and said second barrier layer making up a layer sequence which is repeated a predetermined number of times;

a first control layer connected to the first barrier layer in a first of the predetermined number of layer sequences; and a second contact layer connected to the second barrier layer in a last of the predetermined number of layer sequences, said parabolic quantum well layer being made up of first, second and third layers, said first and third layers being made of aluminum gallium arsenide ($Al_xGa_{1-x}As$), said second layer being made of gallium arsenide (GaAs).

5. A semiconductor device as claimed in claim 4 in which an aluminum (Al) content x in said parabolic quantum well layer varies with a parabolic curve.

6. A semiconductor device as claimed in claim 4 in which said first and second barrier layers are made of aluminum gallium arsenide ($Al_xGa_{1-x}As$), said parabolic quantum well layer comprising a plurality of third barrier layers made of aluminum gallium arsenide (AlGaAs) and a plurality of well layers respectively made of gallium arsenide (GaAs) and formed between said third barrier layers, said third barrier layers having a constant thickness, said well layers having thicknesses which respectively differ.

7. A semiconductor device comprising:

a first barrier layer;

a second barrier layer, said first and second barrier layers being made of a first material selected from a group of aluminum gallium arsenide (AlGaAs), indium phosphor (InP) and indium aluminum arsenide (InAlAs);

a parabolic quantum well layer formed between said first and second barrier layers and having a bottom of a conduction band with an energy which varies from a junction between the first barrier layer and the parabolic quantum well layer to a junction between the second barrier layer and the parabolic quantum well layer with a parabolic curve so that bottoms of conduction bands at the junctions between the first and second barrier layers and the parabolic quantum well layer are higher than at a central portion of the parabolic quantum well layer, said first barrier layer, said parabolic quantum well layer and said second barrier layer making up a layer sequence which is repeated a predetermined number of times;

a first contact layer connected to the first barrier layer in a first of the predetermined number of layer sequences;

a second contact layer connected to the second barrier layer in a last of the predetermined number of layer sequences, said parabolic quantum well layer being made up of first, second and third layers, said first and third layers being made of said first material, said second layer being made of a second material selected from a group of gallium arsenide (GaAs) and indium gallium arsenide (InGaAs).

* * * * *